United States Patent
Amarilio et al.

(10) Patent No.: US 9,949,027 B2
(45) Date of Patent: Apr. 17, 2018

(54) SYSTEMS AND METHODS FOR HANDLING SILENCE IN AUDIO STREAMS

(71) Applicant: QUALCOMM Incorporated, San Diego, CA (US)

(72) Inventors: Lior Amarilio, Yokneam (IL); Amit Gil, Zichron Yaakov (IL); Oded Schnitzer, Haifa (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/087,208

(22) Filed: Mar. 31, 2016

(65) Prior Publication Data
US 2017/0289679 A1    Oct. 5, 2017

(51) Int. Cl.
H04R 29/00    (2006.01)
H04R 3/00    (2006.01)
H03G 3/34    (2006.01)

(52) U.S. Cl.
CPC ............. *H04R 3/007* (2013.01); *H03G 3/348* (2013.01)

(58) Field of Classification Search
CPC ....... H04R 3/007; G10L 19/018; H03G 3/348
USPC ...................... 381/55, 58–59, 94.5
See application file for complete search history.

(56) References Cited

U.S. PATENT DOCUMENTS

| | | | |
|---|---|---|---|
| 4,663,765 A | 5/1987 | Sutphin et al. | |
| 8,892,228 B2 | 11/2014 | Muesch | |
| 9,065,576 B2 * | 6/2015 | Mammone | G10L 19/26 |
| 2002/0196363 A1 | 12/2002 | Furusawa et al. | |
| 2003/0093267 A1 | 5/2003 | Leichtling et al. | |
| 2008/0005216 A1 | 1/2008 | Mallinson et al. | |
| 2009/0259671 A1 | 10/2009 | Garudadri et al. | |
| 2010/0020985 A1 | 1/2010 | Majumdar et al. | |
| 2010/0086147 A1 * | 4/2010 | Hung | H04S 7/307 381/98 |
| 2012/0065754 A1 | 3/2012 | Pennock | |
| 2013/0279714 A1 * | 10/2013 | Mammone | G10L 19/26 381/77 |
| 2015/0255081 A1 | 9/2015 | Mammone et al. | |
| 2016/0267919 A1 | 9/2016 | Cao et al. | |

FOREIGN PATENT DOCUMENTS

WO    2015070691 A1    5/2015

OTHER PUBLICATIONS

Cáceres, Juan-Pablo et al., "Jacktrip: Under the Hood of an Engine for Network Audio," Journal of New Music Research, vol. 39, No. 3, 2010, 4 pages.

(Continued)

*Primary Examiner* — Disler Paul
(74) *Attorney, Agent, or Firm* — Withrow & Terranova, PLLC

(57) ABSTRACT

Systems and methods for handling silence in audio streams are disclosed. In one aspect, a transmitter detects a halt in an audio stream. After detection of the halt in the audio stream, the transmitter embeds a silence signal into the audio stream and transmits the silence signal to associated receivers. The associated receivers may respond to the embedded silence signal by "playing" silence or by using the silence signal to activate a silence protocol. In either event, the associated receivers do not receive the original audio halt and do not produce an unwanted audio artifact.

14 Claims, 8 Drawing Sheets

(56) References Cited

OTHER PUBLICATIONS

Author Unknown, "Draft Specification for Serial Low-power Interchip Media Bus (SLIMbus®)," MIPI Alliance, Version 1.3, Revision 06, Feb. 14, 2015, 256 pages.
Author Unknown, "Specification for SoundWire," MIPI Alliance, Version 1.0, Jan. 21, 2015, 289 pages.
International Search Report and Written Opinion for PCT/US2017/020587, dated May 9, 2017, 16 pages.
Second Written Opinion for PCT/US2017/020587, dated Feb. 28, 2018, 5 pages.

* cited by examiner

SYSTEMS AND METHODS FOR HANDLING SILENCE IN AUDIO STREAMS

BACKGROUND

I. Field of the Disclosure

The technology of the disclosure relates generally to audio streams and particularly to SOUNDWIRE audio streams.

II. Background

Mobile computing devices, such as cellular telephones, smart phones, and the like, have become increasingly common throughout modern society. The increase in use of such devices is attributable in part to the increased functionality of such devices. In particular, many such devices have evolved from simple telephony devices into a mobile terminal that may support various multimedia inputs and outputs to expand the capability of the devices to produce a variety of multimedia content for the user.

Various exemplary protocols have been proposed and adopted relating to how audio signals are handled within a mobile computing device. In particular, a Serial Low-power Inter-chip Media Bus (SLIMbus™) published by the MIPI® Alliance has been promulgated and updated as recently as February 2015. While SLIMbus has numerous advocates, it has seen relatively slow adoption by the industry. In response thereto, MIPI proposed the SOUNDWIRE specification as an alternate audio bus.

In a SOUNDWIRE interface, audio artifacts, such as pops or clicks, may result from a halt in an audio stream. Such artifacts may occur because software associated with a receiver in the SOUNDWIRE interface does not detect the halt until after the halt has already been played. The presence of such audio artifacts is exacerbated in relatively fast audio streams such as pulse density modulation (PDM) streams. The presence of such audio artifacts negatively affects the audience experience and accordingly, reduction or elimination of such audio artifacts would improve the audience experience.

SUMMARY OF THE DISCLOSURE

Aspects disclosed in the detailed description include systems and methods for handling silence in audio streams. In particular, exemplary aspects of the present disclosure detect, at a transmitter, a halt in an audio stream. After detection of the halt in the audio stream, the transmitter embeds a silence signal into the audio stream and transmits the silence signal to associated receivers. The associated receivers may respond to the embedded silence signal by "playing" silence, or by using the silence signal to activate a silence protocol such as a muting of a speaker output. In either event, the associated receivers do not receive the original audio halt and do not produce an unwanted audio artifact.

In this regard in one aspect, a method of preventing audio artifacts at a speaker is disclosed. The method includes detecting an audio halt in an audio stream. The method also includes selecting one of a plurality of silent tones to embed in the audio stream at the audio halt. The method also includes embedding a selected one of the plurality of silent tones into the audio stream. The method also includes transmitting the audio stream to a speaker across an audio bus.

In another aspect, a host is disclosed. The host includes a bus interface configured to be coupled to an audio bus. The host also includes an audio halt detector configured to detect an audio halt in an audio stream. The host also includes a transmitter coupled to the bus interface and configured to receive the audio stream from the audio halt detector. The host also includes a multiplexer configured to embed one of a plurality of silent tones into the audio stream at the audio halt. The host also includes a control system configured to select the one of the plurality of silent tones.

In another aspect, a device is disclosed. The device includes a bus interface configured to be coupled to an audio bus. The device also includes a receiver coupled to the bus interface and configured to receive an audio stream therefrom. The device also includes a silent tone detector configured to sample the audio stream and detect an embedded silent tone therein. The device also includes a control system configured to mute output from an associated speaker in response to detection of the embedded silent tone.

In another aspect, a method of preventing audio artifacts at a speaker is disclosed. The method includes receiving an audio stream from an audio bus. The method also includes detecting within the audio stream an embedded silent tone. The method also includes, in response to detection of the embedded silent tone, muting output from an associated speaker.

DETAILED DESCRIPTION

Figure 1:
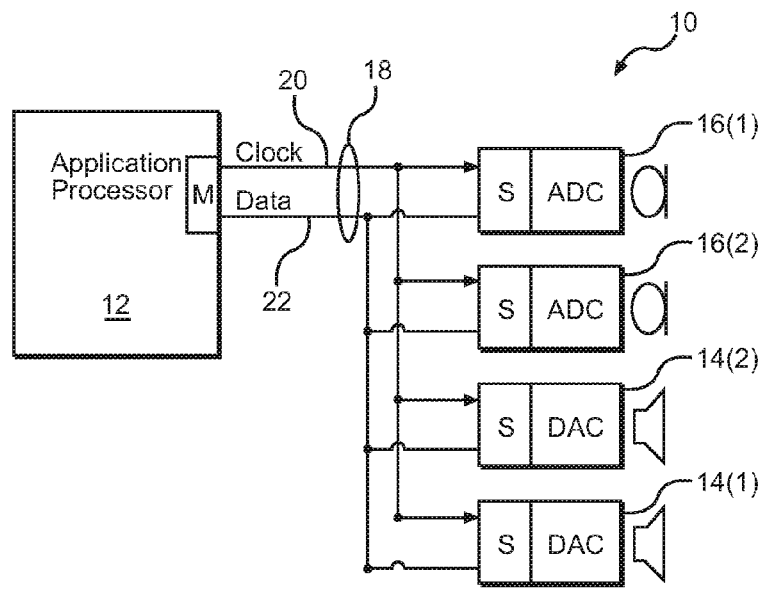
FIG. 1 is a block diagram of an exemplary conventional SOUNDWIRE system.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems and methods for handling silence in audio streams. In particular, exemplary aspects of the present disclosure detect, at a transmitter, a halt in an audio stream. After detection of the halt in the audio stream, the transmitter embeds a silence signal into the audio stream and transmits the silence signal to associated receivers. The associated receivers may respond to the embedded silence signal by "playing" silence, or by using the silence signal to activate a silence protocol such as muting a speaker output. In either event, the associated receivers do not receive the original audio halt and do not produce an unwanted audio artifact.

While exemplary aspects of the present disclosure are well suited for use in a SOUNDWIRE audio system, the present disclosure is not so limited. Other audio systems may also benefit from exemplary aspects of the present disclosure. Nonetheless, to assist in understanding the present disclosure, the following discussion is provided with reference to a SOUNDWIRE audio system. Further, before addressing exemplary aspects of the present disclosure, a brief overview of a conventional SOUNDWIRE audio system is provided with reference to FIGS. 1 through 2B. Exemplary aspects of the present disclosure are discussed below beginning with reference to FIG. 3.

In this regard, FIG. 1 is block diagram of an exemplary conventional SOUNDWIRE system 10. The SOUNDWIRE system 10 includes an application processor 12 coupled to a plurality of microphones 14(1)-14(2) and a plurality of speakers 16(1)-16(2) by a two-wire bus 18. The two-wire bus 18 includes a clock line 20 and a data line 22. The application processor 12 is generally regarded as a master of the SOUNDWIRE system 10 and the plurality of microphones 14(1)-14(2) and each of the plurality of speakers 16(1)-16(2) (as well as any other audio components) are slaves. While illustrated as the application processor 12, it should be appreciated that the application processor 12 could be replaced by a codec (not illustrated). More information on the SOUNDWIRE specification may be found at Specification for SOUNDWIRE, version 1, released Jan. 21, 2015, available at members.mipi.org/wg/LML/document/folder/8154 to MIPI members.

While the SOUNDWIRE specification refers to a master and a slave, it should be appreciated that other specifications may use different terminology. Further, while SOUNDWIRE contemplates that the master will generally be an audio source, slaves such as the plurality of microphones 14(1)-14(2) may also be audio sources. Thus, as used herein, the term "host" is sometimes used to designate an audio source and the term "device" is sometimes used to designate an audio sink.

Figure 2A:
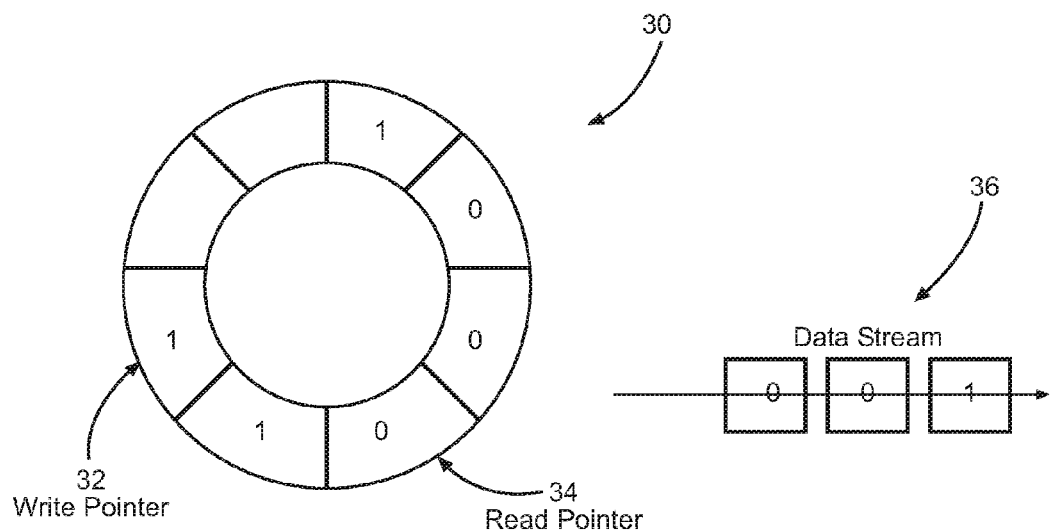
FIG. 2A illustrates a first in-first out (FIFO) buffer.

In the SOUNDWIRE system 10, there may be a plurality of data channels that are time division multiplexed onto the data line 22. Each data channel operates at an audio data rate. In practice, a first in-first out (FIFO) buffer, typically a ring or cyclic buffer, stores data channel values for each data channel. FIG. 2A illustrates such a FIFO buffer 30. New data is written into the FIFO buffer 30 at write pointer 32 and data is read from the FIFO buffer 30 at read pointer 34. As the data is read from the read pointer 34, a data stream 36 is created.

Figure 2B:
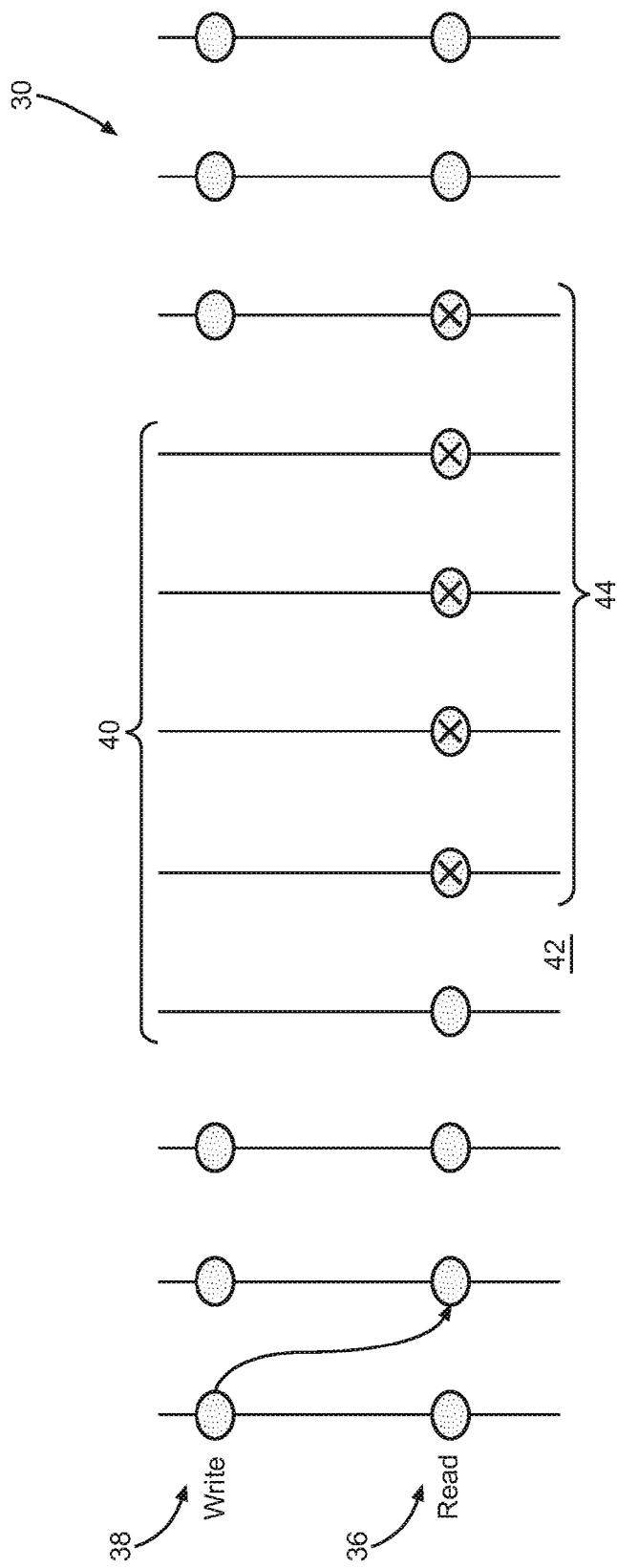
FIG. 2B is a simplified view of a conventional audio stream at a transmitter and a receiver.

When no data is being written into the FIFO buffer 30, it is not certain what data is read out of the FIFO buffer 30, and thus, the signal on the data channel is unknown. Such ambiguous data may cause a blip, click, chirp, or other audio artifact when played at a device such as a speaker. This situation is illustrated in FIG. 2B, where write data stream 38 is written into the FIFO buffer 30, and at time 40, an audio halt occurs where no data is written into the FIFO buffer 30. As illustrated, the data stream 36 lags the write data stream 38 by one cycle, and thus, at time 42, there is no new data to be read from the FIFO buffer 30 (i.e., an underflow condition). Thus, data 44 is unknown and may cause audio artifacts at the device. Conventional solutions rely on software to detect audio halts and take corrective action. However, current software solutions are relatively slow and do not communicate the audio halt until after the unknown data has been received by the device. Accordingly, most conventional systems will allow the listener to perceive the audio artifact before the software takes corrective action.

Exemplary aspects of the present disclosure proactively detect the underflow condition and replace the unknown data with a silent tone. Receipt of the silent tone at the device allows the device to mute an output or "play" silence such that the listener does not experience an audio artifact. Such proactive detection is, in an exemplary aspect, detected using hardware, speeding the corrective action relative to conventional software techniques.

Figure 3:
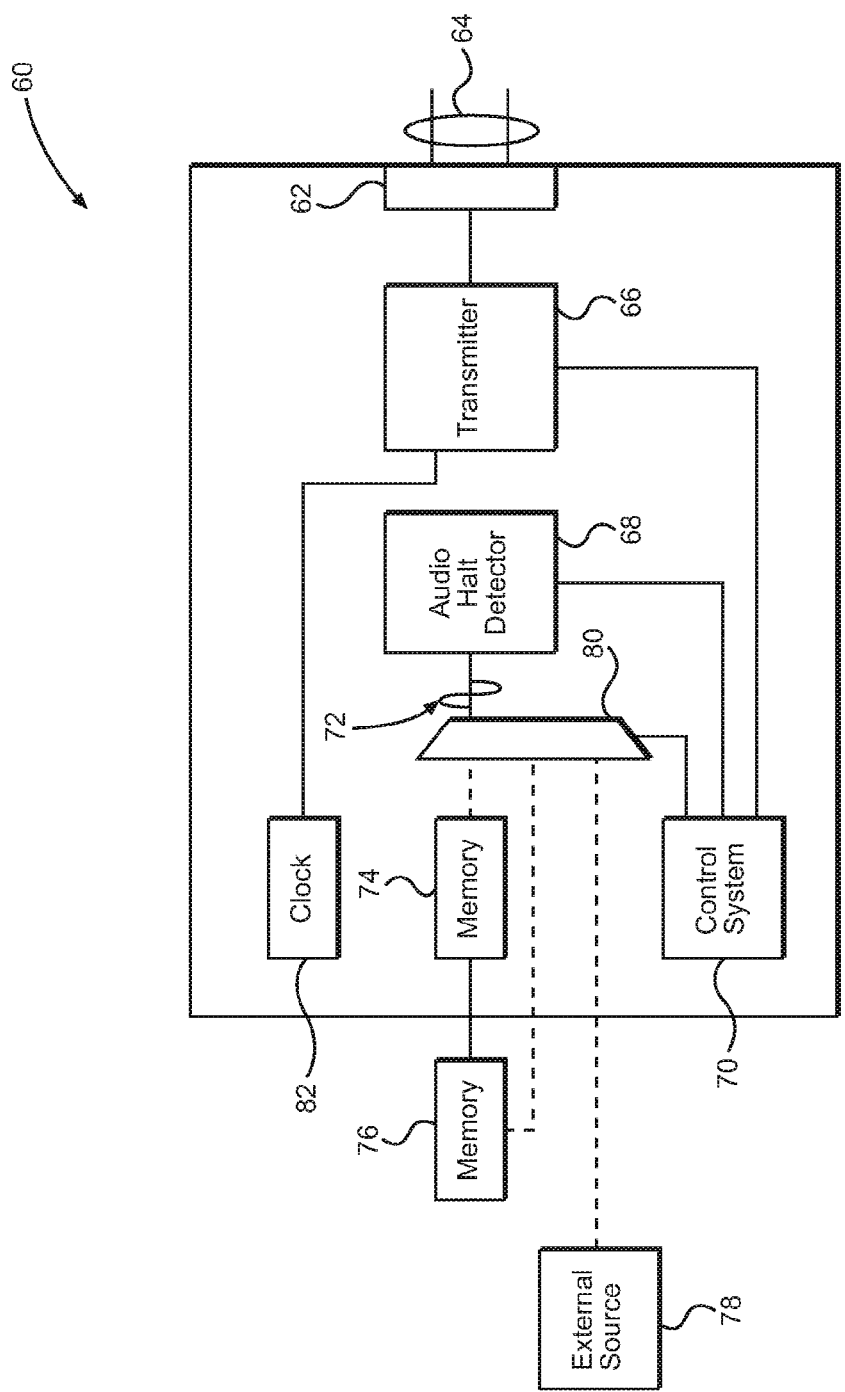
FIG. 3 is a simplified block diagram of a host in an audio system according to an exemplary aspect of the present disclosure.

In this regard, FIG. 3 illustrates a simplified block diagram of a host 60 according to an exemplary aspect of the present disclosure. The host 60 includes a bus interface 62 configured to be coupled to an audio bus 64. As noted above, the audio bus 64 may be a SOUNDWIRE audio bus. The bus interface 62 may be coupled to a transmitter 66, which in turn is coupled to an audio halt detector 68 and a control system 70. The audio halt detector 68 receives a digital encoded audio stream 72 from local memory 74, external memory 76, or some other external source 78. In an exemplary aspect, the digital encoded audio stream 72 is output from a multiplexer 80 that is coupled to and selects between data from the local memory 74, the external memory 76, or the other external source 78. A clock 82 may generate a clock signal that is used by various elements within the host 60 and passed to a remote device through the transmitter 66. Note that while the clock 82 is shown inside the host 60, it should be appreciated that the clock 82 may be an external clock (not illustrated) without departing from the scope of the present disclosure.

Figure 4:
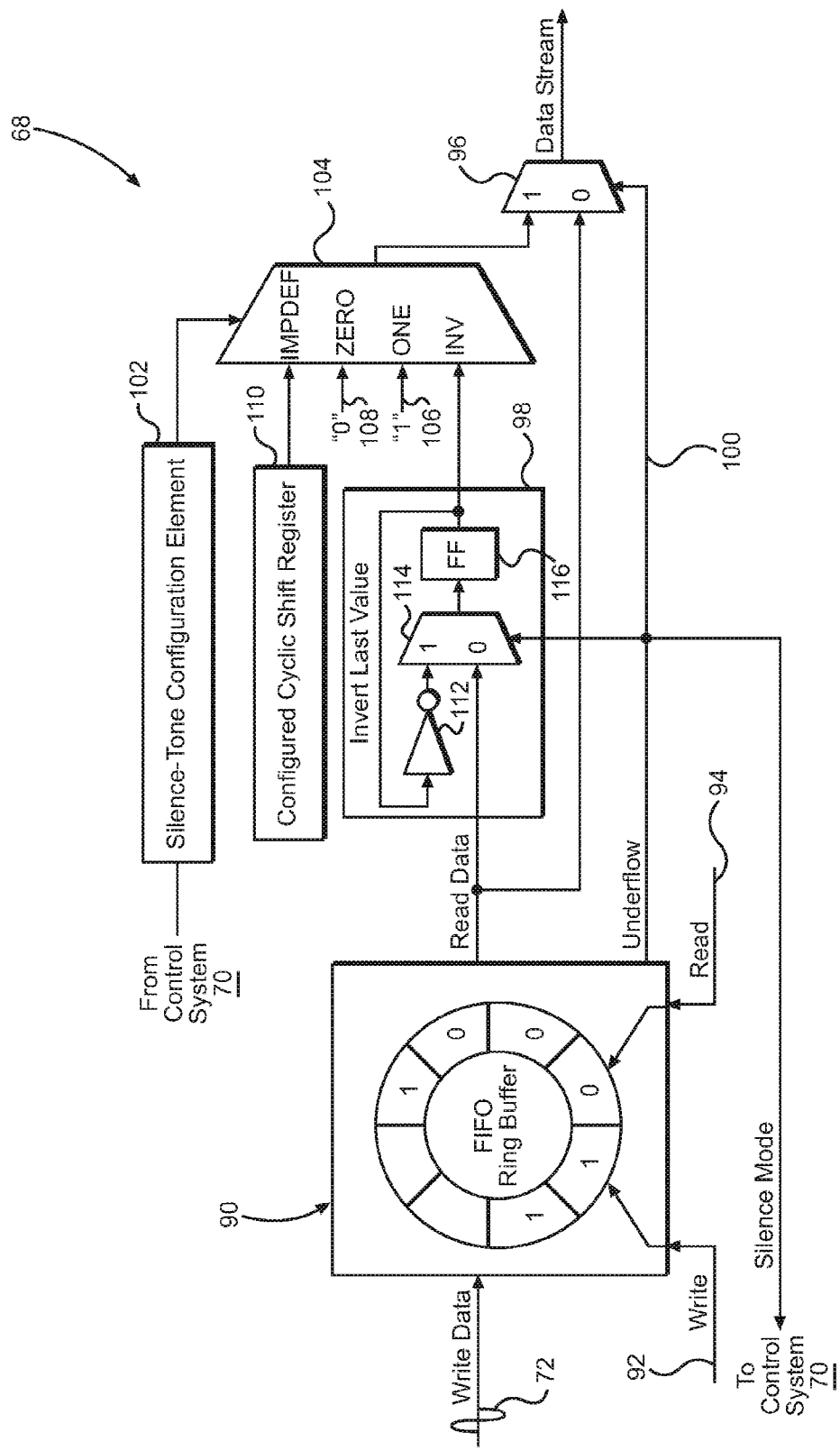
FIG. 4 is a more detailed view of a halt detector and a silent tone selector of the host of FIG. 3.

FIG. 4 illustrates more detail about the audio halt detector 68 of FIG. 3. In particular, the audio halt detector 68 may include a FIFO ring buffer 90 that receives the digital encoded audio stream 72 and uses the digital encoded audio stream 72 as write data for the FIFO ring buffer 90. The FIFO ring buffer 90 includes a write pointer 92 where data is written into the FIFO ring buffer 90 and a read pointer 94 from which data is read from the FIFO ring buffer 90. The data read from the FIFO ring buffer 90 is split and provided to an output multiplexer 96 and an alternating output element 98. The FIFO ring buffer 90 also includes an underflow signal 100 that is provided to the control system 70 (not shown in FIG. 4), the output multiplexer 96, and the alternating output element 98. The control system 70 provides control signals to a silence-tone configuration element 102 that, in turn, controls a signal multiplexer 104. The signal multiplexer 104 selects between a plurality of silent tones as outlined below. A first silent tone is a string of repeated ones as provided by a ones input 106. A second silent tone is a string of repeated zeroes as provided by a zeroes input 108. A third silent tone is provided by the alternating output element 98. A fourth silent tone is provided by a configured cyclic shift register 110.

With continued reference to FIG. 4, the alternating output element 98 includes an inverter 112, a multiplexer 114, and a flip flop 116 (referenced in the drawings as "FF"). The multiplexer 114 receives the data read from the FIFO ring buffer 90 and an output of the inverter 112. The multiplexer 114 is activated by the underflow signal 100 from the FIFO ring buffer 90. These elements combine to produce the third silent tone that is a series of alternating ones and zeroes (e.g., 10101010).

With continued reference to FIG. 4, the configured cyclic shift register 110 may be configured to provide a repeating pattern of ones and zeroes. Exemplary repeating patterns include, but are not limited to: 1001011010010110, 0110100101101001, 1100110011001100, and 00110011001100110011. The values of the shift register within the configured cyclic shift register 110 may be set to output the desired repeating pattern.

Figure 5:
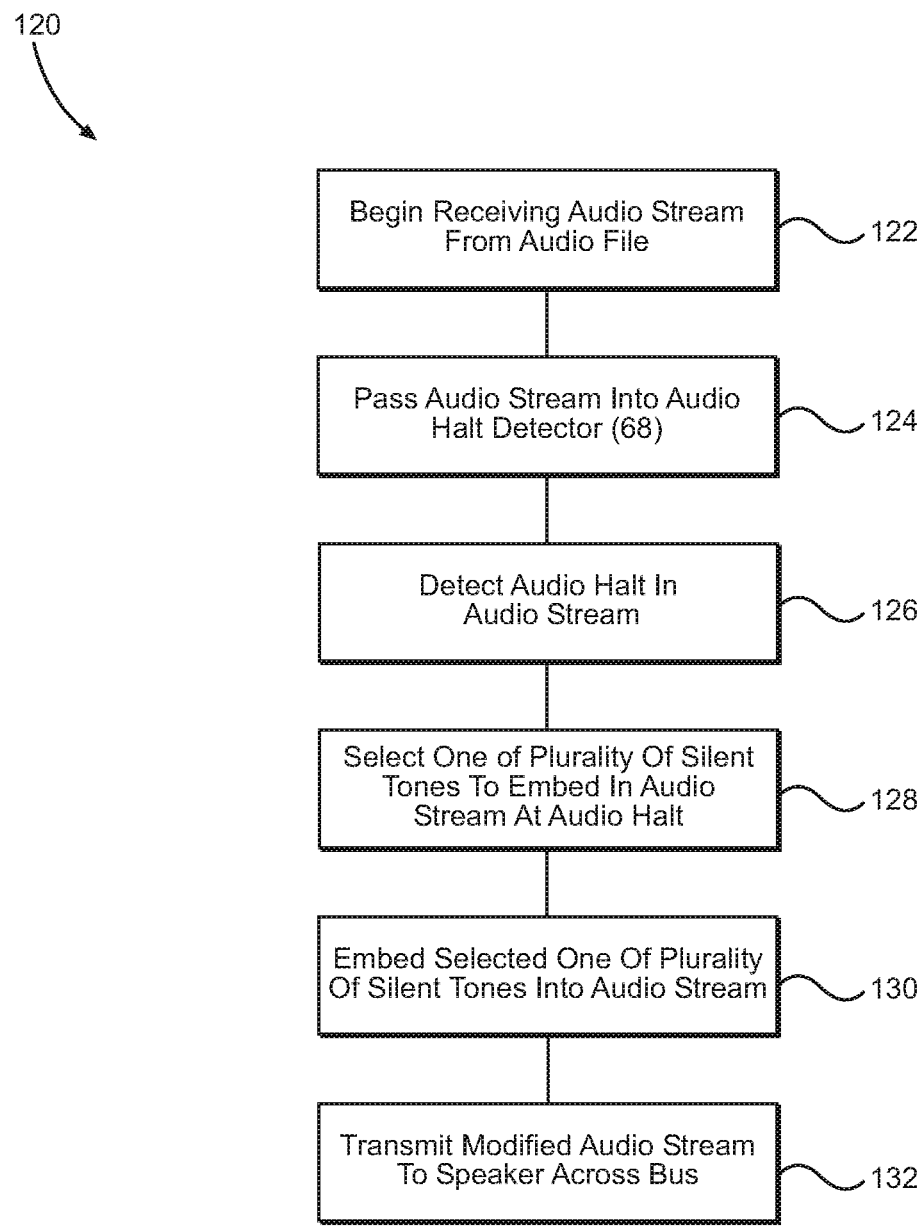
FIG. 5 is a flowchart associated with exemplary processes that occur in the host of FIG. 3.

Exemplary aspects of the present disclosure allow the host to detect an audio halt in an audio stream and send a silent tone to a remote device to allow the remote device to play silence or mute an audio output so as to avoid output of an unwanted audio artifact. In this regard, FIG. 5 is a flowchart associated with exemplary processes that occur in the host 60 of FIG. 3. In particular, a process 120 begins by receiving an audio stream such as from an audio file (block 122). The audio stream passes into the audio halt detector 68 (block 124) such as by writing into the FIFO ring buffer 90, and the audio halt detector 68 detects an audio halt in the audio stream (block 126). The control system 70 may select one of a plurality of silent tones to embed in the audio stream at the audio halt (block 128). The selection may be based on whether the entity to which the audio stream is being sent is a legacy device that understands silent tones or a device optimized to work with exemplary aspects of the present disclosure. Likewise, the selection may further be based on whether the audio stream is encoded through a pulse code modulation (PCM) technique or a pulse density modulation (PDM) technique. It should be appreciated that PDM operates at a much higher frequency than PCM, and thus, it is harder to catch the audio halt in a timely fashion.

With continued reference to FIG. 5, the control system 70 causes the selected one of the plurality of silent tones to be embedded into the audio stream at the audio halt (block 130). Such embedding is done through the silence-tone configuration element 102 selecting an input for the signal multiplexer 104 and the selected output of the signal multiplexer 104 being selected by the output multiplexer 96 instead of the read data from the FIFO ring buffer 90. The modified audio stream (i.e., the original audio stream combined with the silent tone) is then transmitted by the transmitter 66 (block 132).

Figure 6:
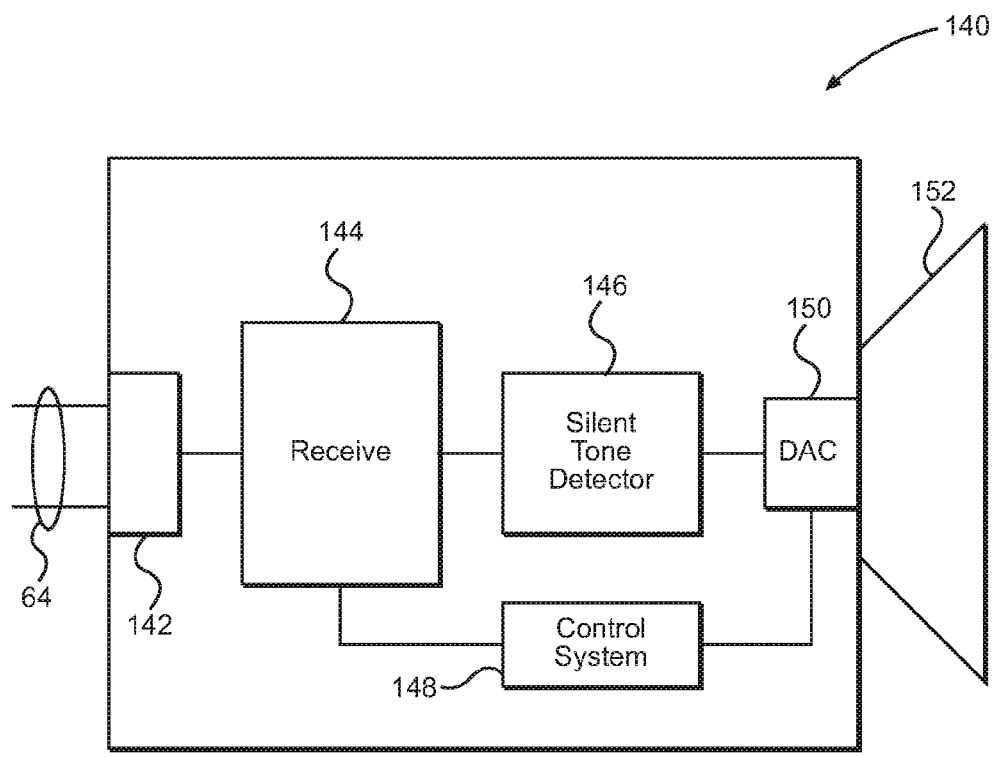
FIG. 6 is a simplified block diagram of a device in an audio system according to an exemplary aspect of the present disclosure.

On the other side of the audio bus 64 of FIG. 3 is an audio sink, also referred to herein as a device 140, illustrated in FIG. 6. The device 140 may include a bus interface 142 configured to be coupled to the audio bus 64. The bus interface 142 is coupled to a receiver 144 which is coupled to a silent tone detector 146 and a control system 148. The control system 148 is also coupled to the silent tone detector 146 and a digital to audio converter (DAC) 150, which may include a speaker 152. In use, the silent tone detector 146 detects the silent tone (i.e., the series of ones, the series of zeroes, the alternating ones and zeroes, or the unique pattern) within the received audio stream and encodes this detected silent tone as if it was an instruction message. Then, based on this instruction, the control system 148 may take an action, such as shutting down the DAC 150, depowering or otherwise turning power off, or the like as needed or desired.

Figure 7:
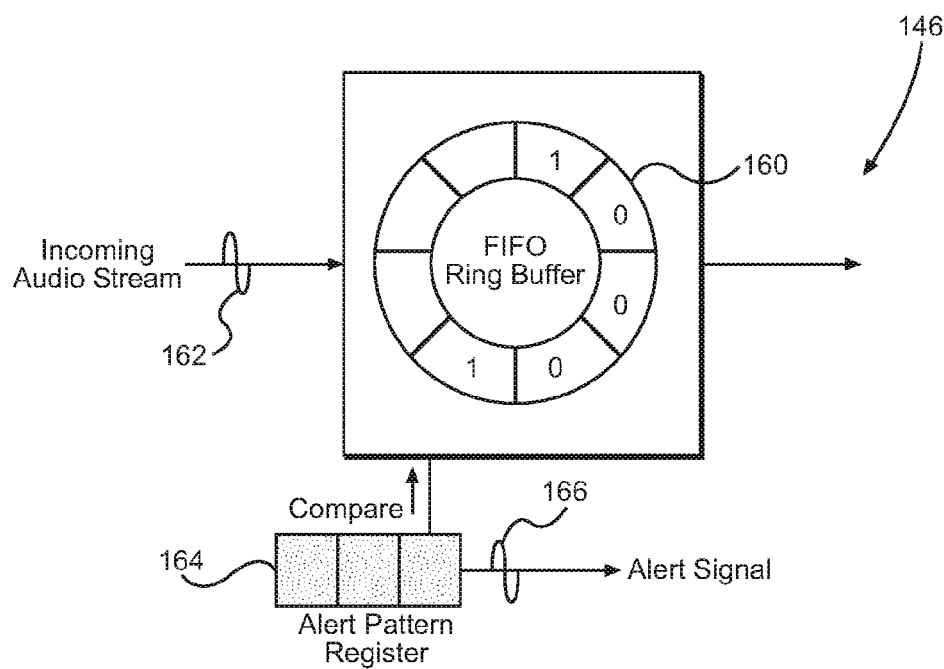
FIG. 7 is a more detailed view of a silent tone detector of the device of FIG. 6.

FIG. 7 is a more detailed view of the silent tone detector 146 of the device 140 of FIG. 6. The silent tone detector 146 may include a FIFO ring buffer 160 that receives an incoming audio stream 162 from the receiver 144. The data in the FIFO ring buffer 160 is compared to an alert pattern register 164, and if there is a match, an alert signal 166 is sent to the control system 148. An output of the FIFO ring buffer 160 then passes to the DAC 150. The data in the alert pattern register 164 should match the selected silent tone from the host 60 of FIG. 3.

Figure 8:
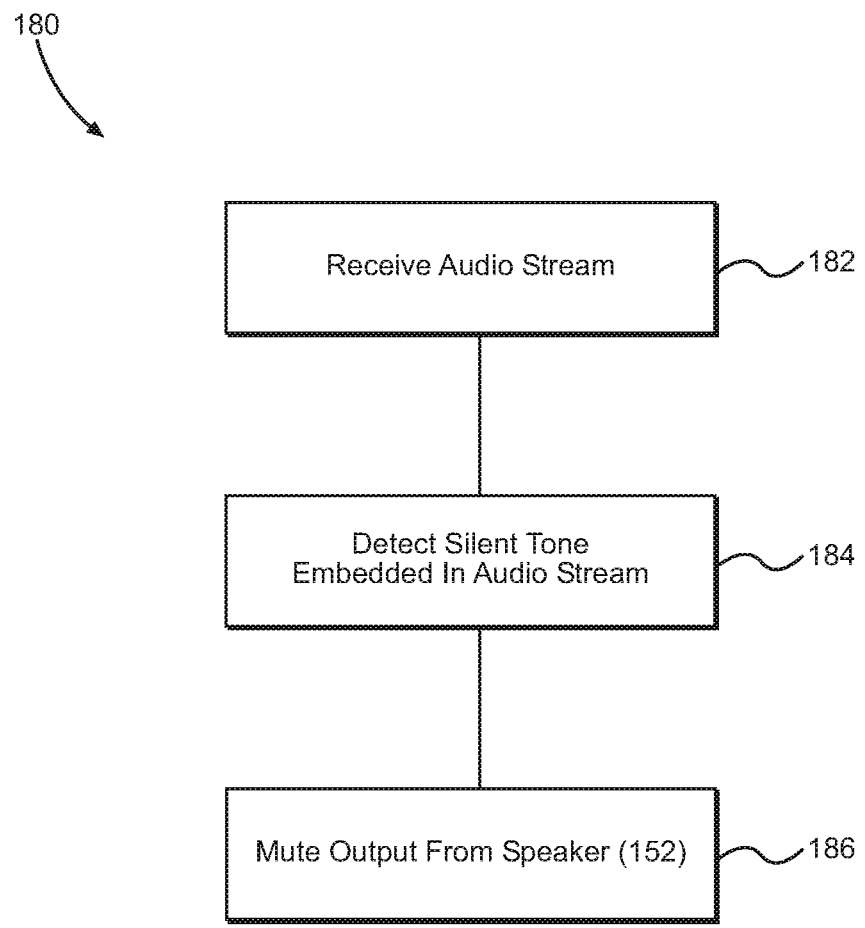
FIG. 8 is a flowchart associated with exemplary processes that occur in the device of FIG. 6.

Exemplary aspects of the present disclosure allow the device to detect a silent tone in the audio stream and play silence or mute an audio output so as to avoid output of an unwanted audio artifact. In this regard, FIG. 8 is a flowchart associated with exemplary processes that occur in the device 140 of FIG. 6. In this regard, a process 180 begins when the device 140 receives an audio stream from the audio bus 64 (block 182). The silent tone detector 146 detects a silent tone embedded in the audio stream (block 184). The control system 148 then causes the output from the speaker 152 to be muted (block 184).

Note that different silent tones may be appropriate for different devices or devices having different capabilities. For example, legacy devices that do not have the ability to detect the silent tone (e.g., the device does not have a silent tone detector 146) may be provided all ones or all zeroes. Receipt of all ones or all zeroes in a PCM audio stream causes the speaker 152 to play silence. That is, the absence of a transition from one to zero is treated as silence by the DAC 150. Likewise, use of alternating ones and zeroes (i.e., 10101010) is interpreted by a PDM receiver as silence. Thus, use of the silent tones set forth herein is backwards compatible for either PCM or PDM legacy devices, and such silent tones may be selected by the control system 148 if an intended recipient device is such a legacy device. Devices equipped with a silent tone detector 146 may, instead of playing silence, mute the output of the speaker 152 after detection of the silent tone embedded in the audio stream.

The systems and methods for handling silence in audio streams according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 9:
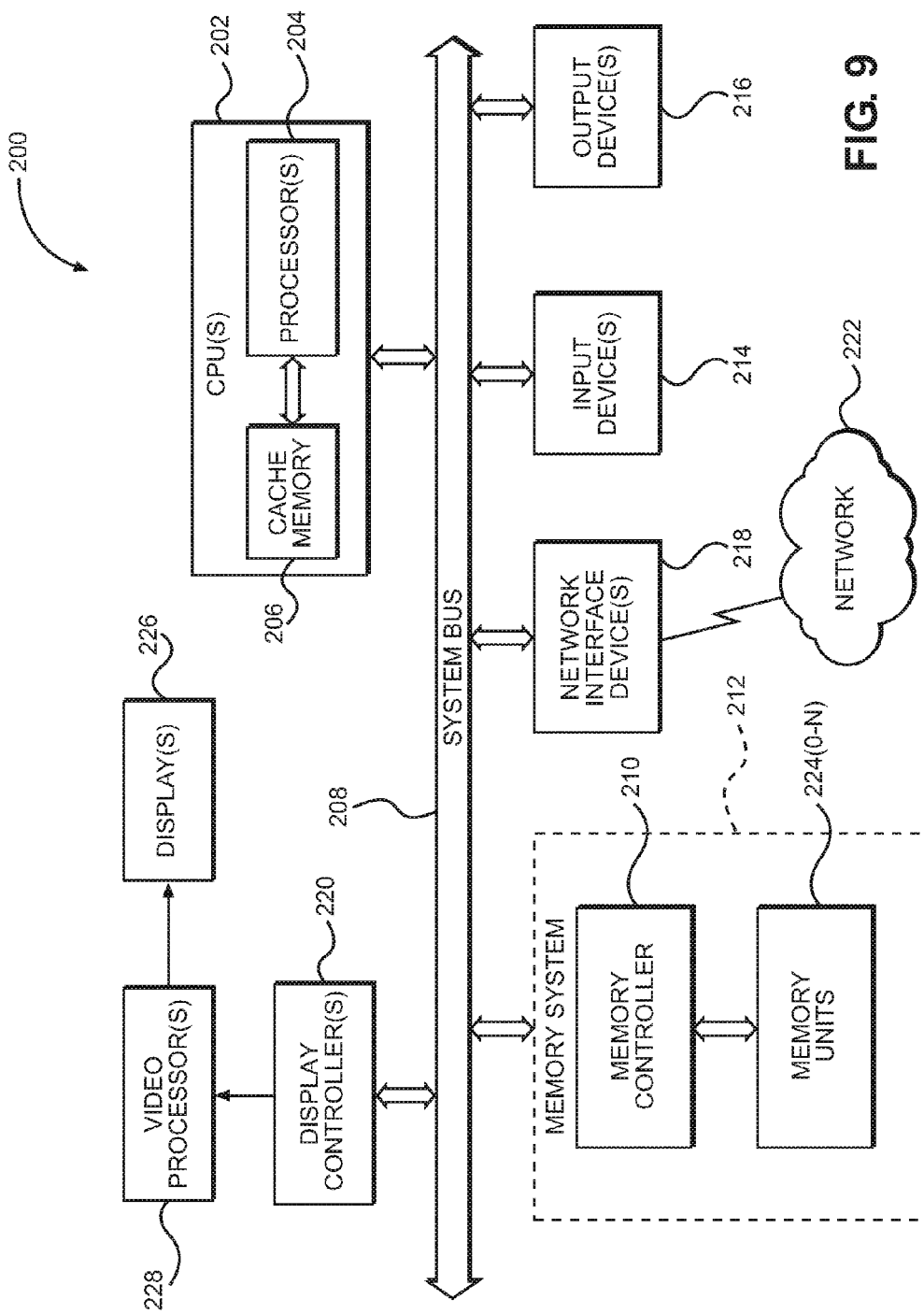
FIG. 9 is a block diagram of an exemplary processor-based system that can include the host of FIG. 3 and the device of FIG. 6.

In this regard, FIG. 9 illustrates an example of a processor-based system 200 that can employ the host 60 illustrated in FIG. 3 and the device 140 illustrated in FIG. 6. In this example, the processor-based system 200 includes one or more central processing units (CPUs) 202, each including one or more processors 204. The CPU(s) 202 may be the host 60. The CPU(s) 202 may have cache memory 206 coupled to the processor(s) 204 for rapid access to temporarily stored data. The CPU(s) 202 is coupled to a system bus 208 and can intercouple master and slave devices included in the processor-based system 200. As is well known, the CPU(s) 202 communicates with these other devices by exchanging address, control, and data information over the system bus 208. For example, the CPU(s) 202 can communicate bus transaction requests to a memory controller 210 as an example of a slave device. Although not illustrated in FIG. 9, multiple system buses 208 could be provided, wherein each system bus 208 constitutes a different fabric.

Other master and slave devices can be connected to the system bus 208. As illustrated in FIG. 9, these devices can include a memory system 212, one or more input devices 214, one or more output devices 216, one or more network interface devices 218, and one or more display controllers 220, as examples. The input device(s) 214 can include any type of input device, including, but not limited to, input keys, switches, voice processors, etc. The output device(s) 216 can include any type of output device, including, but not limited to, audio, video, other visual indicators, etc. It should be appreciated that the SOUNDWIRE audio bus 64 may be coupled in parallel to the system bus 208 and couple output device(s) 216 to an audio source such as the CPU 202. The network interface device(s) 218 can be any devices configured to allow exchange of data to and from a network 222. The network 222 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 218 can be configured to support any type of communications protocol desired. The memory system 212 can include one or more memory units 224(0-N).

The CPU(s) 202 may also be configured to access the display controller(s) 220 over the system bus 208 to control information sent to one or more displays 226. The display controller(s) 220 sends information to the display(s) 226 to be displayed via one or more video processors 228, which process the information to be displayed into a format suitable for the display(s) 226. The display(s) 226 can include any type of display, including, but not limited to, a cathode ray tube (CRT), a liquid crystal display (LCD), a plasma display, a light emitting diode (LED) display, etc. It should be appreciated that not every device that includes a SOUNDWIRE audio bus 64 will include all of the elements described in relation to the processor-based system 200. For example, some such devices may not have a display or a network connection. However, the presence or absence of a particular element of this sort does not remove the processor-based system 200 from the scope of the present disclosure if exemplary aspects of the silent tone are included.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of preventing audio artifacts at a speaker, the method comprising:
   detecting an audio halt in an audio stream;
   selecting one of a plurality of silent tones to embed into the audio stream at the audio halt;
   embedding a selected one of the plurality of silent tones into the audio stream; and
   transmitting the audio stream to a speaker across an audio bus; and
   wherein the selecting is based on whether the speaker is a legacy speaker.

2. The method of claim 1, wherein detecting the audio halt comprises detecting the audio halt within a first in-first out (FIFO) ring buffer.

3. The method of claim 1, wherein embedding the selected one of the plurality of silent tones into the audio stream comprises multiplexing a data flow with the selected one of the plurality of silent tones.

4. The method of claim 1, wherein selecting the one of the plurality of silent tones comprises selecting a silent tone from among the group consisting of: all ones, all zeroes, alternating ones and zeros, and a repeating pattern of ones and zeroes.

5. The method of claim 1, wherein transmitting the audio stream comprises transmitting the audio stream across a SOUNDWIRE audio bus.

6. The method of claim 1, wherein selecting the one of the plurality of silent tones comprises basing, at least in part, the selecting on whether the audio stream is a pulse density modulated (PDM) audio stream or a pulse code modulated (PCM) audio stream.

7. The method of claim 1, wherein selecting the one of the plurality of silent tones comprises using a multiplexer to select between the plurality of silent tones.

8. A host comprising:
a bus interface configured to be coupled to an audio bus;
an audio halt detector configured to detect an audio halt in an audio stream;
a transmitter coupled to the bus interface and configured to receive the audio stream from the audio halt detector;
a multiplexer configured to embed one of a plurality of silent tones into the audio stream at the audio halt; and
a control system configured to select one of the plurality of silent tones based on whether a speaker to which the one of the plurality of silent tones is to be sent is a legacy speaker.

9. The host of claim 8, wherein the audio halt detector comprises a first in-first out (FIFO) ring buffer.

10. The host of claim 8, further comprising a second multiplexer configured to be controlled by the control system to select the one of the plurality of silent tones.

11. The host of claim 10, wherein the second multiplexer configured to select the one of the plurality of silent tones is configured to select a silent tone from among the group consisting of: all ones, all zeroes, alternating ones and zeros, and a repeating pattern of ones and zeroes.

12. The host of claim 8, wherein the bus interface comprises a SOUNDWIRE audio bus interface.

13. The host of claim 8 integrated into an integrated circuit (IC).

14. The host of claim 8 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *